United States Patent
Lee et al.

(10) Patent No.: US 10,553,772 B2
(45) Date of Patent: Feb. 4, 2020

(54) APPARATUS FOR MANUFACTURING THERMOELECTRIC MODULE

(71) Applicant: Hyundai Motor Company, Seoul (KR)

(72) Inventors: Han Saem Lee, Seoul (KR); Jong Kook Lee, Gyeonggi-Do (KR); Kyong Hwa Song, Seoul (KR); Byung Wook Kim, Gyeonggi-do (KR); Jin Woo Kwak, Gyeongsangbuk-do (KR); Gyung Bok Kim, Gyeonggi-Do (KR); In Woong Lyo, Gyeonggi (KR)

(73) Assignee: Hyundai Motor Company, Seoul (KR)

( * ) Notice: Subject to any disclaimer, the term of this patent is extended or adjusted under 35 U.S.C. 154(b) by 653 days.

(21) Appl. No.: 15/156,685

(22) Filed: May 17, 2016

(65) Prior Publication Data

US 2017/0352793 A1   Dec. 7, 2017

(30) Foreign Application Priority Data

Mar. 29, 2016  (KR) .................... 10-2016-0037947

(51) Int. Cl.
*H01L 35/34* (2006.01)
*H01L 35/08* (2006.01)
*H01L 35/32* (2006.01)

(52) U.S. Cl.
CPC .............. *H01L 35/34* (2013.01); *H01L 35/08* (2013.01); *H01L 35/32* (2013.01)

(58) Field of Classification Search
CPC ...................................................... H01L 35/34
See application file for complete search history.

(56) References Cited

U.S. PATENT DOCUMENTS

| 5,950,067 A | 9/1999 | Maegawa et al. |
| 6,347,521 B1 | 2/2002 | Kadotani et al. |
| 6,528,026 B2 | 3/2003 | Hajduk et al. |
| 2008/0079109 A1 | 4/2008 | Luo |

FOREIGN PATENT DOCUMENTS

| GB | 772972 A | * | 4/1957 | .......... B29C 66/001 |
| JP | 2004311505 A | * | 11/2004 | |
| JP | 2005-217055 A | | 8/2005 | |
| JP | 2010238741 A | * | 10/2010 | |
| KR | 10-2002-0026923 A | | 4/2002 | |

OTHER PUBLICATIONS

Office Action dated Oct. 9, 2019 in corresponding Chinese Application No. 201610421324.1.

* cited by examiner

*Primary Examiner* — Livius R. Cazan
(74) *Attorney, Agent, or Firm* — Mintz Levin Cohn Ferris Glovsky and Popeo, P.C.; Peter F. Corless

(57) ABSTRACT

An apparatus for manufacturing a thermoelectric module is provided. The apparatus includes a thermoelectric element interposed between a lower substrate that includes a lower electrode and an upper substrate that includes an upper electrode. Additionally, the apparatus includes a first block that is configured to support the lower substrate and a second block that is configured to move vertically with respect to the first block and support the upper substrate. A jig is configured to position the thermoelectric element in connection with the upper electrode and the lower electrode.

9 Claims, 11 Drawing Sheets

APPARATUS FOR MANUFACTURING THERMOELECTRIC MODULE

CROSS-REFERENCE TO RELATED APPLICATION

This application is based on and claims the benefit of priority to Korean Patent Application No. 10-2016-0037947, filed on Mar. 29, 2016 in the Korean Intellectual Property Office, the disclosure of which is incorporated herein in its entirety by reference.

TECHNICAL FIELD

The present disclosure relates to an apparatus for manufacturing a thermoelectric module, and more particularly, to an apparatus for manufacturing a thermoelectric module that secures structural stability and power stability.

BACKGROUND

Generally, a thermoelectric module may be configured to include a pair of thermoelectric elements. For example, upper electrodes are connected to upper parts of the thermoelectric elements, lower electrodes are connected to lower parts of the thermoelectric elements, an upper substrate supports the upper electrodes and a lower substrate supports the lower electrodes. The existing method for manufacturing a thermoelectric module positions a pair of thermoelectric elements between the lower electrode of the lower substrate and the upper electrode of the upper substrate. Bonding materials (e.g., a brazing filler) are heated (at high temperature within a furnace when the bonding materials are interposed between a lower end of the thermoelectric element and the lower electrode and between an upper end of the thermoelectric element and the upper electrode.

However, the existing method for manufacturing a thermoelectric module has a disadvantage in that when the brazing filler used as goes through a phase change from a solid to a liquid at a temperature equal to or higher than a melting point. Accordingly, the thermoelectric element moves and therefore is unstably retained at a fixed position. In particular, a connection between the thermoelectric element and the electrodes is not smoothly made. In other words, the bonding performance between the thermoelectric element and the electrode is weak, thereby producing the thermoelectric module with quality defects. Further, disadvantages of the existing method for manufacturing a thermoelectric module include applying heat to the substrate or the thermoelectric element itself as well as a bonded part between the thermoelectric element and the electrodes. Namely, cracks occur in the substrate or the thermoelectric element due to the thermal shock, thereby reducing the power stability of the thermoelectric module. Further, the thermoelectric element is exposed to a high temperature within the furnace and the power performance of the thermoelectric module as well as the bonding performance between the thermoelectric element and the electrodes is reduced due to high temperature oxidation.

The above information disclosed in this section is merely for enhancement of understanding of the background of the invention and therefore it may contain information that does not form the prior art that is already known in this country to a person of ordinary skill in the art.

SUMMARY

The present disclosure provides an apparatus for manufacturing a thermoelectric module having improved structural stability and power stability by positioning a thermoelectric element with respect to a lower electrode and an upper electrode. Further, the position of the thermoelectric element may be more stably retained, and may improve the bonding performance between the thermoelectric element and the electrodes.

According to an exemplary embodiment of the present disclosure, an apparatus for manufacturing a thermoelectric module in which a thermoelectric element may be disposed between a lower substrate provided with a lower electrode and an upper substrate provided with an upper electrode, may include a first block that may be configured to support the lower substrate and a second block that may be configured to move vertically with respect to the first block and support the upper substrate. A jig may be configured to position the thermoelectric element in connection with the upper electrode and the lower electrode.

In particular, the jig may include a slot configure to receive the thermoelectric element. The jig may include a plurality of jigs aligned in a vertical direction and the slots of the plurality of jigs may be aligned to intersect with each other at a predetermined angle and thus, the slots may have an overlapping area with each other. The first block may include a seating groove configured to receive the lower substrate. Additionally, the first block may have a guide portion configured to guide a mounting position of the jig around the seating groove. The second block may have a seating groove configured to receive the upper substrate.

An interior of the first block may include a first heater and the first heater may be configured to apply heat to a bonding material disposed between the lower electrode and a lower end of the thermoelectric element. An interior of the second block may include a second heater and the second heater may be configured to apply heat to a bonding material interposed between the upper electrode and an upper end of the thermoelectric element. A guide structure configured to guide a vertical movement of the second block may be installed between the first block and the second block. The guide structure may include a guide bar that extends in a vertical direction (e.g., upwardly) from the first block and a guide aperture formed in the second block.

According to an exemplary embodiment of the present disclosure, an apparatus for manufacturing a thermoelectric module with a lower substrate, a lower electrode, a thermoelectric element, an upper electrode, and an upper substrate, may include a first block configured to support the lower substrate, and a second block separated from an upper part of the first block and configured to press the upper substrate to the lower substrate. A jig may be configured to position the thermoelectric element between the first block and the second block and may retain the positioned state thereof. A first heater may be installed within the first block and a second heater may be installed within the second block.

The jig may include a first jig having a first slot that extends along a first direction and a second jig having a second slot that extends along a second direction. The first jig and the second jig may be aligned to have the first slot and the second slot intersect with each other at a predetermined angle. Both ends of the first jig may include a pair of first steps that may be configured to be inserted into an edge of the second jig. Both ends of the second jig may include a pair of second steps that may be configured to be inserted into an edge of the first jig.

BRIEF DESCRIPTION OF THE DRAWINGS

The above and other objects, features and advantages of the present disclosure will be more apparent from the following detailed description taken in conjunction with the accompanying drawings.

Figure 1:
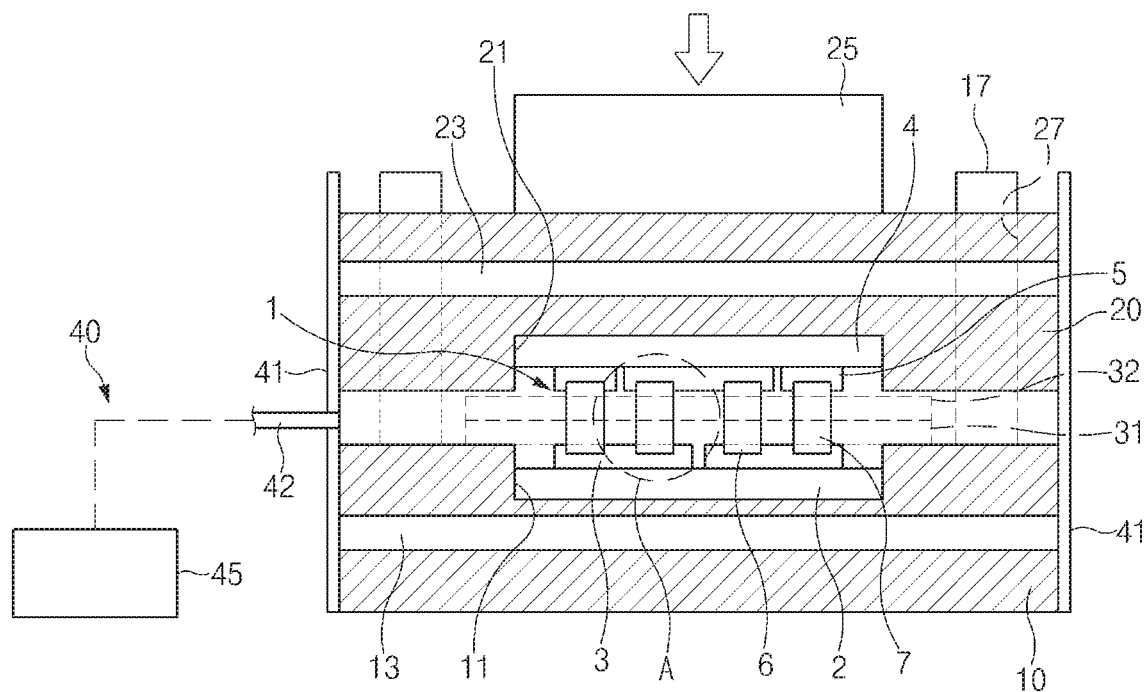
FIG. 1 is an exemplary cross-sectional view illustrating an apparatus for manufacturing a thermoelectric module according to an exemplary embodiment of the present disclosure.
Figure 2:
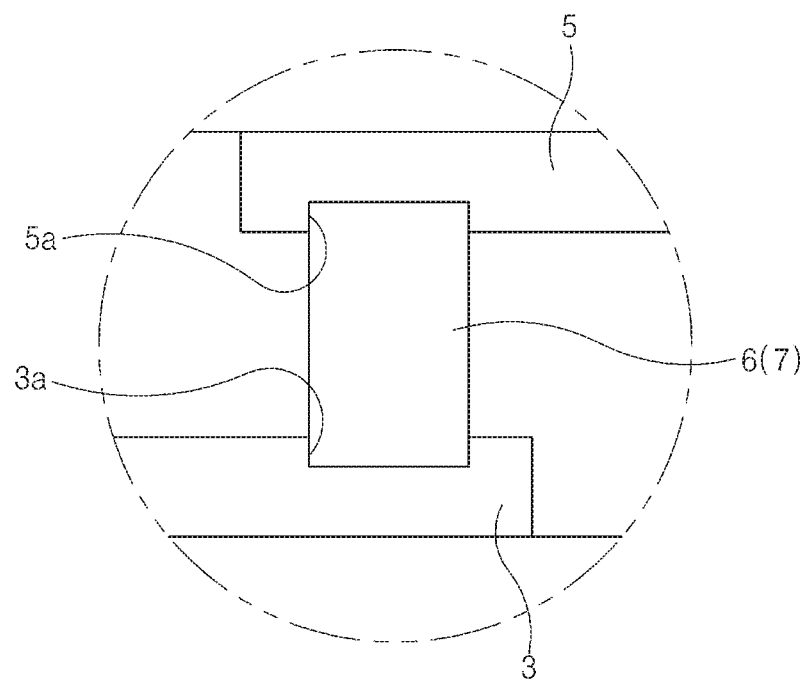
FIG. 2 is an exemplary enlarged view of arrow part A of FIG. 1 according to an exemplary embodiment of the present disclosure.

It should be understood that the appended drawings are not necessarily to scale, presenting a somewhat simplified representation of various exemplary features illustrative of the basic principles of the invention. The specific design features of the present invention as disclosed herein, including, for example, specific dimensions, orientations, locations, and shapes will be determined in part by the particular intended application and use environment. In the figures, reference numbers refer to the same or equivalent parts of the present invention throughout the several figures of the drawing.

DETAILED DESCRIPTION

Hereinafter, exemplary embodiments of the present disclosure will be described in detail with reference to the accompanying drawings. For reference, a size of components, a thickness of a line, and the like which are illustrated in the drawing referenced for describing exemplary embodiments of the present disclosure may be slightly exaggerated for convenience of understanding. Further, terms used to describe the present disclosure are defined in consideration of functions in the present disclosure and therefore may be changed depending on a user, an operator's intention, a practice, and the like. Therefore, the definition of the terminologies should be construed based on the contents throughout the specification.

An apparatus for manufacturing a thermoelectric module according to various exemplary embodiments of the present disclosure may be configured to manufacture a thermoelectric module 1 having improved structural stability and power stability.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present invention clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

FIG. 1 illustrates an exemplary embodiment of a thermoelectric module 1. The thermoelectric module 1 may include a lower substrate 2, a lower electrode 3 disposed on a top surface of the lower substrate 2, an upper substrate 4, an upper electrode 5 disposed on a bottom surface of the upper substrate 4, and at least a pair of thermoelectric elements 6 and 7 that may be alternately connected between the lower electrode 3 and the upper electrode 5. The pair of thermoelectric elements 6 and 7 may be made of an N-type semiconductor and a P-type semiconductor which have opposite polarity to each other. Referring to FIG. 1, the apparatus for manufacturing a thermoelectric module according to various exemplary embodiments of the present disclosure may include a first block 10, a second block 20 configured to move vertically with respect to the first block 10, and jigs 31 and 32 configured to position the thermoelectric elements 6 and 7 with respect to the lower electrode 3 and the upper electrode 5 and retain the positioned state thereof.

Figure 4:
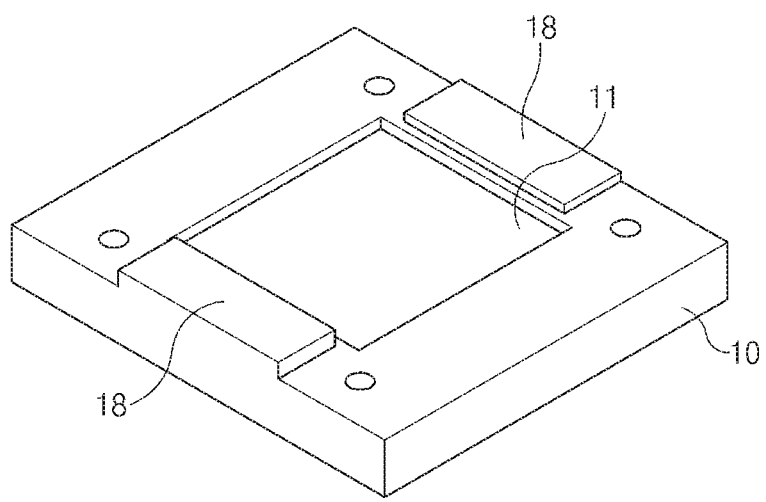
FIG. 4 is an exemplary perspective view illustrating a first block of the apparatus for manufacturing a thermoelectric module according to the exemplary embodiment of the present disclosure.
Figure 5:
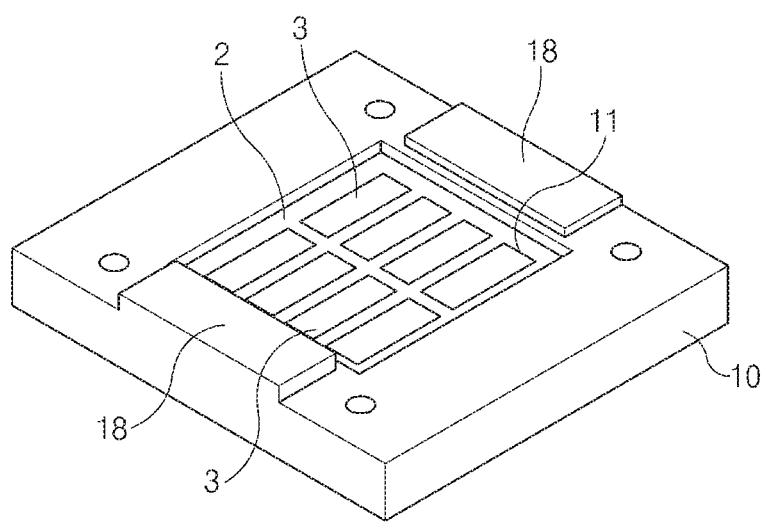
FIG. 5 is an exemplary diagram illustrating a state in which a lower substrate to which a lower electrode is attached is seated in the first block of the apparatus for manufacturing a thermoelectric module according to the exemplary embodiment of the present disclosure, together with the lower electrode.

The first block 10 may be configured to upwardly support the lower substrate 2. In particular, as illustrated in FIGS. 1 and 4, a top surface of the first block 10 may be formed with a seating groove 11. As illustrated in FIG. 5, the seating groove 11 of the first block 10 may be seated with the lower substrate 2, to stably support the lower substrate 2. In particular, the top surface of the lower substrate 2 may be bonded to the lower electrode 3 by an adhesive, or the like. The lower substrate 2 may have a structure in which the lower electrode 3 may be integrally formed on the top surface of the lower substrate 2.

Alternatively, the seating groove 11 of the first block 10 may be seated with the lower substrate 2. The top surface of the lower substrate 2 may be bonded to the lower electrode 3 by the adhesive, or the like When the lower substrate 2 is seated in the seating groove 11 of the first block 10, the lower substrate 2 may be supported to the first block 10 and the thermoelectric elements 6 and 7 may be positioned in the lower electrode 3 of the lower substrate 2. In particular, a bonding material may be interposed between the lower electrode 3 and lower ends of the thermoelectric elements 6 and 7. Next, the upper substrate 4 may be disposed and integrally formed on the upper electrode 5. In particular, the bonding material may be interposed between the upper electrode 5 and upper ends of the thermoelectric elements 6 and 7. Therefore, the pair of thermoelectric elements 6 and 7 may be positioned between the lower electrode 3 and the upper electrode 5. For example, the upper electrode 5 may be coupled with the upper substrate 4. Furthermore, the upper substrate 4 may be formed in a structure in which a bottom surface thereof is integrally provided with the upper electrode 5.

Moreover, the lower electrode 3 may include a groove portion 3a having a shape that corresponds to the lower ends of the thermoelectric elements 6 and 7. The lower ends of the thermoelectric elements 6 and 7 may be configured to be inserted into the groove portion 3a of the lower electrode 3. The upper electrode 5 may include a groove portion 5a having a shape that corresponds to the upper ends of the thermoelectric elements 6 and 7. The upper ends of the thermoelectric elements 6 and 7 may be inserted into the groove portion 5a of the upper electrode 5. The thermoelectric elements 6 and 7 may be positioned by the groove portion 3a of the lower electrode 3 and the groove portion 5a of the upper electrode 5.

Further, the bonding materials such as a brazing filler may be applied to the groove portion 3a of the lower electrode 3 and the groove portion 5a of the upper electrode 5 in advance. The lower ends and the upper ends of the thermoelectric elements 6 and 7 may be bonded to the groove portion 3a of the lower electrode 3 and the groove portion 5a of the upper electrode 5 by the bonding materials.

The second block 20 may be configured to move vertically over the first block 10 to support the upper substrate 4 downwardly. As illustrated in FIG. 1, a bottom surface of the second block 20 may include a seating groove 21. Therefore, as illustrated in FIG. 1, the seating groove 21 of the second block 20 may be seated with the upper substrate 4. For example, the upper substrate 4 and the upper electrode 5 may be more stably supported by the second block 20. In particular, the second block 20 may be configured to move toward the first block 10 downwardly, and thus the second block 20 may be configured to press the upper substrate 4 to the lower substrate 2.

According to the exemplary embodiment of the present disclosure, an external force may be applied to the second block 20 and thus the second block 20 may be configured to press the upper substrate 4. For example, a balance weight 25 having a predetermined weight may be disposed on the top surface of the second block 20. The second block 20 may be configured to press the upper substrate 4 to the lower substrate 2 by the weight of the balance weight 25 to bond the upper ends and the lower ends of the thermoelectric elements 6 and 7 to the upper electrode 5 and the lower electrode 3 by the bonding material. Namely, the thermoelectric module 1 may secure the structural stability and the power stability.

According to another exemplary embodiment of the present disclosure, a self weight of the second block 20 may be formed to press the upper substrate 4 to the lower substrate 2 without the separate balance weight. Guide structures 17 and 27 may be configured to stably guide the vertical movement of the second block 20 with respect to the first block 10. The guide structures 17 and 27 may include at least a guide bar 17 that extends upwardly in the first block 10 and a guide aperture 27 formed in the second block 20. Therefore, when the second block 20 moves vertically with respect to the first block 10, the guide aperture 27 of the second block 20 may be guided along the guide bar 17 of the first block 10, and the vertical movement thereof may be guided more stably.

The bonding materials such as the brazing filler may be interposed between the lower ends of the thermoelectric elements 6 and 7 and the lower electrode 3 and between the upper ends of the thermoelectric elements 6 and 7 and the upper electrode 5. The bonding materials may be heated to be melted, to bond the upper ends of the thermoelectric elements 6 and 7 to the upper electrode 5 while bonding the lower ends of the thermoelectric elements 6 and 7 to the lower electrode 3.

An interior of the first block 10 may include a first heater 13 that may be disposed adjacent to the top surface of the first block 10 when the lower substrate 2 is seated therein. Accordingly, heat may be applied to the bonding materials interposed between the lower electrode 3 of the lower substrate 2 and the lower ends of the thermoelectric elements 6 and 7. Therefore, the first heater 13 may intensively heat the bonding materials interposed between the lower electrode 3 of the lower substrate 2 and the lower ends of the thermoelectric elements 6 and 7. The bonding performance between the lower ends of the thermoelectric elements 6 and 7 and the lower electrode 3 may thus be improved and the high temperature oxidation of the rest portions may be minimized.

An interior of the second block 20 may include a second heater 23. The second heater 23 may be disposed adjacent to the bottom surface of the second block 20 when the upper substrate 4 is seated therein and may be configured to apply heat to the bonding materials disposed between the upper electrode 5 of the upper substrate 4 and the upper ends of the thermoelectric elements 6 and 7. Therefore, the second heater 23 may be configured to intensively heat the bonding materials disposed between the upper electrode 5 of the upper substrate 4 and the upper ends of the thermoelectric elements 6 and 7. Accordingly, the bonding performance between the upper ends of the thermoelectric elements 6 and 7 and the upper electrode 5 may be improved and the high temperature oxidation of the rest portions may be minimized.

The jigs 31 and 32 may be configured to position the thermoelectric elements 6 and 7 between the first block 10 and the second block 20 and retain the positioned state thereof. Further, the jigs 31 and 32 may be made of insulating materials such as ceramic. According to various exemplary embodiments of the present disclosure, the jigs 31 and 32 may have at least one slot 31a and 32a to position and retain the thermoelectric elements 6 and 7. These slots 31a and 32a may have an appropriate width and length to receive a pair of thermoelectric elements 6 and 7. The slots 31a and 32a may be formed in a structure in which a first end thereof is opened and a second end thereof is closed. The thermoelectric elements 6 and 7 may be positioned and retained while being received within the slots 31a and 32a of the jigs 31 and 32. For example, by positioning and retaining the jigs 31 and 32, the upper ends of the thermoelectric elements 6 and 7 may be bonded to the upper electrode 5 and the lower ends of the thermoelectric elements 6 and 7 may be bonded to the lower electrode 3. Namely, the thermoelectric elements 6 and 7 may be connected to the upper electrode 5 and the lower electrode 3.

According to various exemplary embodiments of the present disclosure, the jigs 31 and 32 may be configured to align two jigs 31 and 32 in a vertical arrangement. The slots 31a and 32a of each of the jigs 31 and 32 may extend along different directions. Therefore, the slots 31a and 32a of the two jigs 31 and 32 may be arranged to intersect with each other at a predetermined angle. In particular, a portion of the slots 31a and 32a of the jigs 31 and 32 may have an overlapping area with each other. The thermoelectric elements 6 and 7 may be inserted into the overlapping area of each of the slots 31a and 32a, to stably position and retain the thermoelectric elements 6 and 7.

Figure 3:
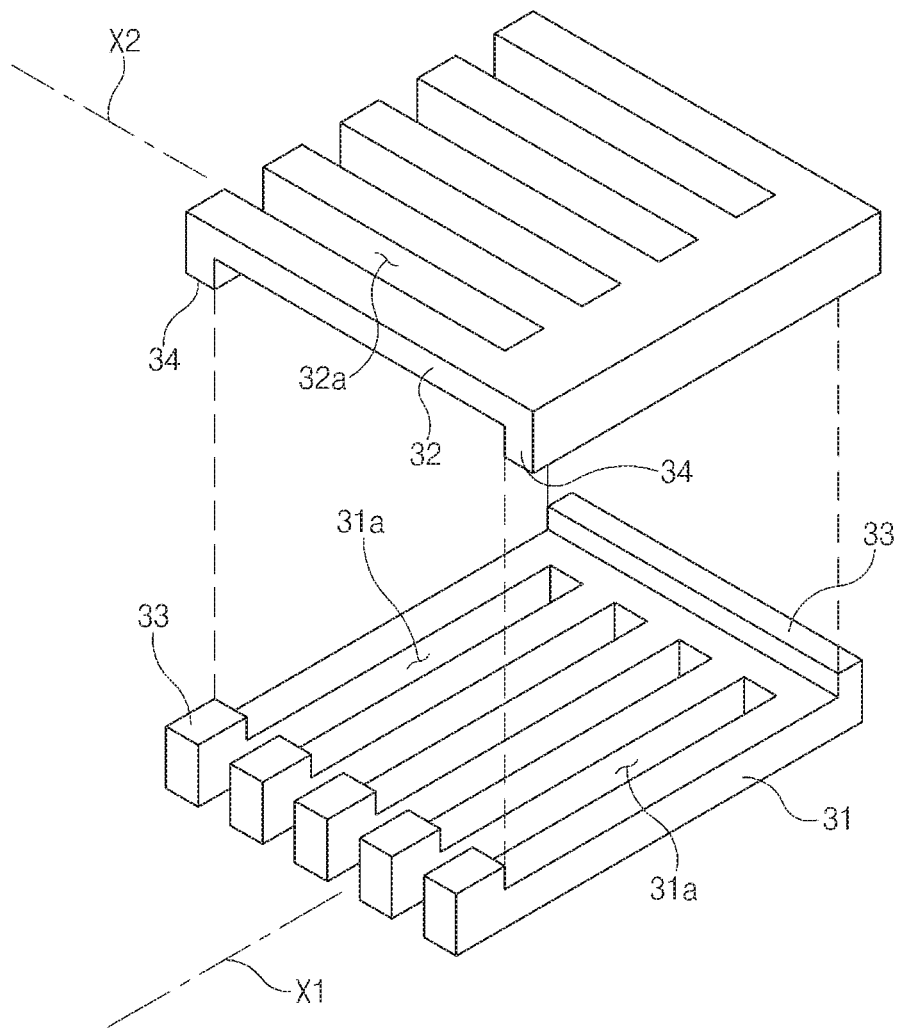
FIG. 3 is an exemplary perspective view illustrating a jig of the apparatus for manufacturing a thermoelectric module according to the exemplary embodiment of the present disclosure.

According to the exemplary embodiment of the present disclosure, as illustrated in FIG. 3, the jigs 31 and 32 may include a first jig 31 having the first slot 31a extending along a first direction X1 and a second jig 32 having a second slot 32a extending along a second direction X2. The first jig 31 and the second jig 32 may be arranged with the first slot 31a and the second slot 32a positioned to intersect with each other at a predetermined angle, to stably position and retain the thermoelectric elements 6 and 7.

An intersecting angle of the first slot 31a of the first jig 31 and the second slot 32a of the second jig 32 may be variously changed based on a shape, an arrangement interval, or the like of the thermoelectric elements 6 and 7. For example, as illustrated in FIG. 3, the first slot 31a and the second slot 32a have a rectangular structure and when the first direction X1 and the second direction X2 are orthogonal to each other the first slot 31a of the first jig 31 and the second slot 32a of the second jig 32 may be orthogonal to each other the first slot 31a and the second slot 32a may have a rectangular shape with an overlapping area and may stably receive the thermoelectric elements 6 and 7 having a rectangular parallelepiped structure.

Meanwhile, a pair of first steps 33 inserted into an edge of the second jig 32 may be formed at both ends of the first jig 31. For example, the first steps 33 of the first jig 31 may be configured to be inserted into the edge of the second jig 32, and the first jig 31 and the second jig 32 may be coupled to each other upon positioning in a stacked arrangement. The overlapping area of the first slot 31a and the second slot 32a may be more stably formed when the first jig 31 and the second jig 32 are coupled to each other, to stably position and retain the thermoelectric elements 6 and 7.

Furthermore, a pair of second steps 34 inserted into an edge of the first jig 31 may be formed at both ends of the second jig 32. The second steps 34 of the second jig 32 may be inserted into the edge of the first jig 31. The second jig 32 and the first jig 31 may be firmly fitting and combined with each other upon being place in a stacked arrangement. The overlapping area of the first slot 31a and the second slot 32a may be more stably formed by the fitting combination of the first jig 31 and the second jig 32, to stably position and retain the thermoelectric elements 6 and 7.

In particular, the first step 33 may be formed at both ends of the first jig 31 and the second step 34 may be formed at both ends of the second jig 32. The first step 33 and the second step 34 may be disposed in an intersecting arrangement with each other. When the first jig 31 and the second jig 32 are disposed in a stacked arrangement, the first step 33 of the first jig 31 may be inserted into the edge of the second jig 32 and the second step 34 of the second jig 32 may be inserted into the edge of the first jig 31, to provide a coupled arrangement of d the first jig 31 and the second jig 32 with each other upon being placed in a stacked vertical arrangement. Therefore, the overlapping area of the first slot 31a and the second slot 32a may be more stably formed and the shape thereof may be firmly retained. Accordingly the thermoelectric elements 6 and 7 inserted into the overlapping area may be positioned and the positioning thereof may be more stably retained.

Figure 7:
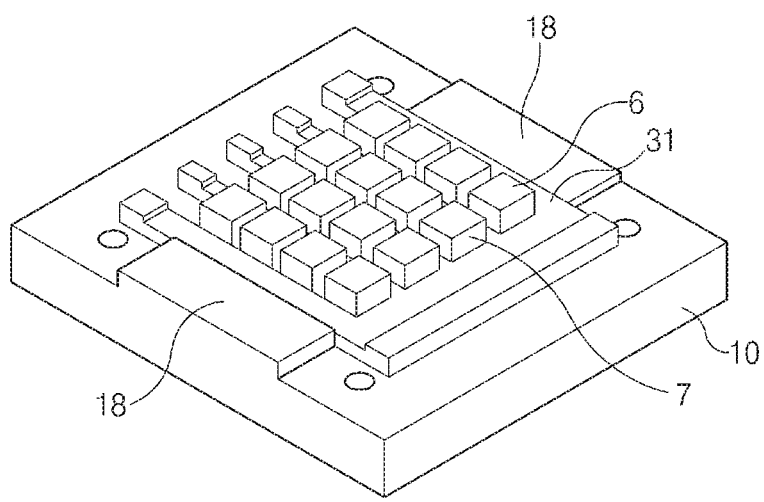
FIG. 7 is an exemplary diagram illustrating a state in which the thermoelectric elements are positioned by a first jig of the apparatus for manufacturing a thermoelectric module according to the exemplary embodiment of the present disclosure.

Further, as illustrated in FIG. 7, a guide portion 18 may be formed to protrude around the seating groove 11 of the first block 10. The guide the guide portion 18 may guide the first jig 31 and the second jig 32 such that mounting positions of the first jig 31 and the second jig 32 with respect to the first block 10 may be stably retained. When the first jig 31 and/or the second jig 32 is positioned by the guide portion 18, the thermoelectric elements 6 and 7 may be positioned and may be stably retained.

FIGS. 4 to 10 are diagrams illustrating a process of manufacturing the thermoelectric module using the apparatus for manufacturing a thermoelectric module according to the exemplary embodiment of the present disclosure. The process of manufacturing the thermoelectric module using the apparatus for manufacturing a thermoelectric module according to the exemplary embodiment of the present disclosure will be described in detail below with reference to FIGS. 4 to 10.

Figure 6:
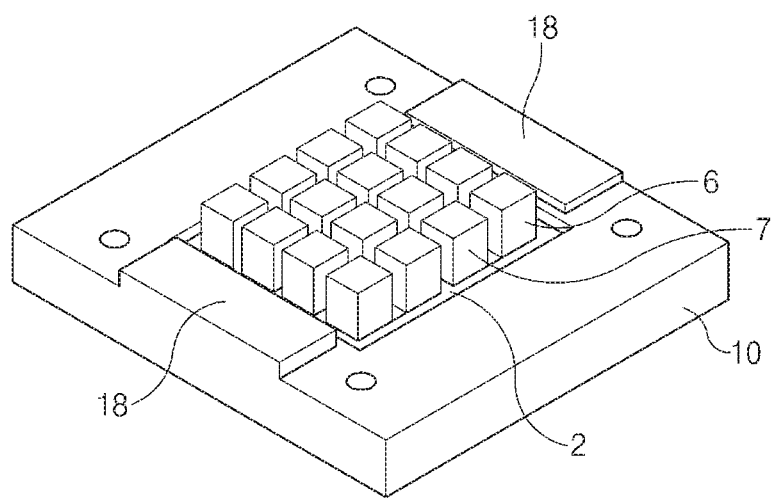
FIG. 6 is an exemplary diagram illustrating a state in which in the apparatus for manufacturing a thermoelectric module according to the exemplary embodiment of the present disclosure, thermoelectric elements are positioned in the lower electrode of the lower substrate supported by the first block according to an exemplary embodiment of the present disclosure.
Figure 8:
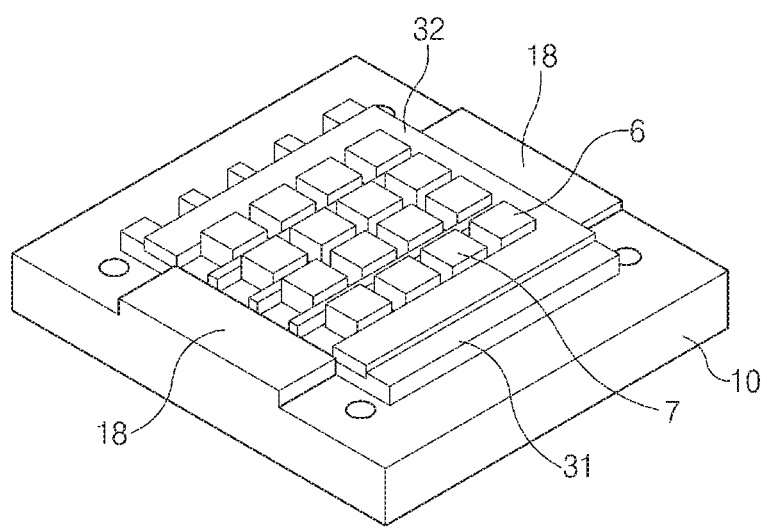
FIG. 8 is an exemplary diagram illustrating a state in which in the apparatus for manufacturing a thermoelectric module according to the exemplary embodiment of the present disclosure, the thermoelectric elements are positioned by the first jig and a second jig which are stacked to intersect with each other.

First, as illustrated in FIGS. 4 and 5, the lower substrate 2 may be disposed in the seating groove 11 of the first block 10. The lower electrode 3 may be bonded to the lower substrate 2 in advance and may be bonded thereto when the lower substrate 2 is seated in the seating groove 11. Next, as illustrated in FIG. 6, the plurality of thermoelectric elements 6 and 7 may be arranged in the lower electrode 3 of the lower electrode 2. For example, the bonding materials such as the brazing filler may be interposed between the lower electrode 3 and the lower ends of the thermoelectric elements 6 and 7. As illustrated in FIG. 7, the first jig 31 may be installed to fit the plurality of thermoelectric elements 6 and 7. Then as illustrated in FIG. 8, the second jig 32 may be arranged (e.g., stacked) on the first jig 31. In particular, the first slot 31a of the first jig 31 and the second slot 32a of the second jig 32 may be disposed to intersect with each other at a predetermined angle, to retain the position of the thermoelectric elements 6 and 7 by the first jig 31 and the second jig 32.

Figure 9:
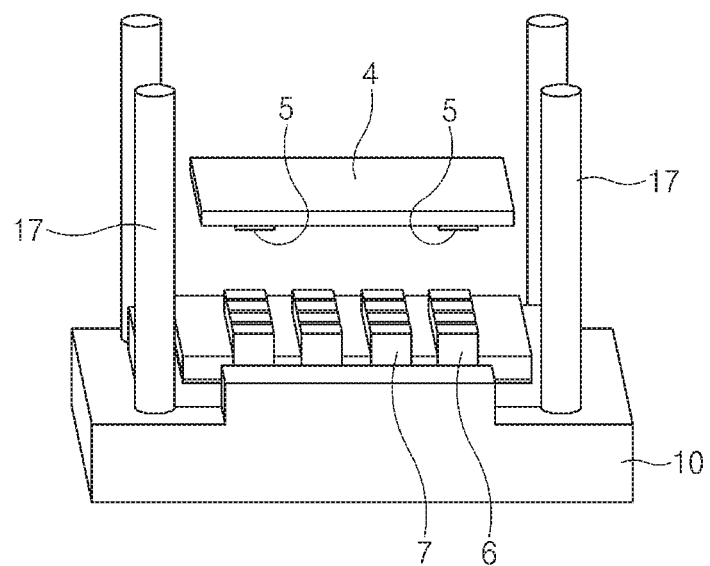
FIG. 9 is an exemplary diagram illustrating a process of seating an upper substrate to which an upper electrode is attached is seated at upper ends of the thermoelectric elements in the apparatus for manufacturing a thermoelectric module according to the exemplary embodiment of the present disclosure.
Figure 10:
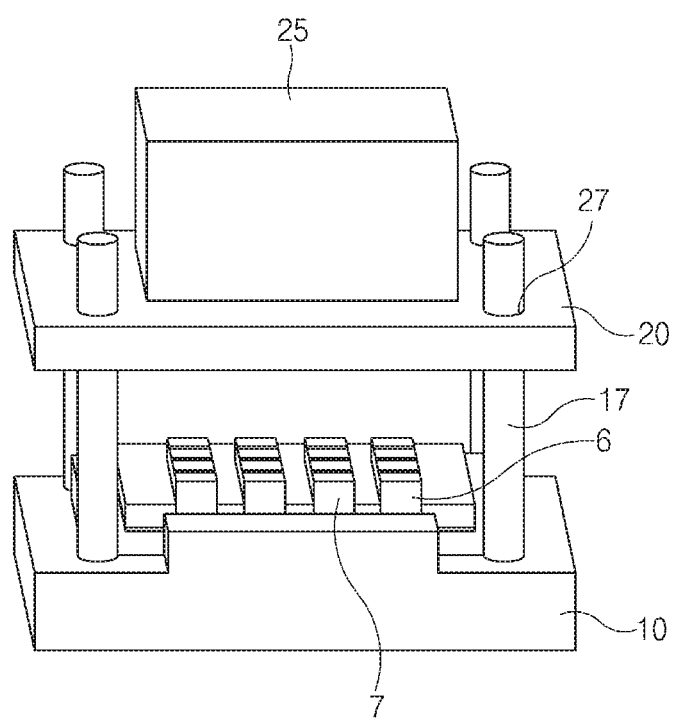
FIG. 10 is an exemplary perspective view illustrating a state in which a second block is installed in the apparatus for manufacturing a thermoelectric module according to the exemplary embodiment of the present disclosure.

Conversely, the first jig 31 and the second jig 32 may be disposed in a stacked arrangement to enable the first slot 31a and the second slot 32a to intersect with each other to form the overlapping area of the first slot 31a and the second slot 32a. The plurality of thermoelectric elements 6 and 7 may be inserted into the overlapping area, and may position and retain the thermoelectric elements 6 and 7 After the thermoelectric elements 6 and 7 are positioned by the jigs 31 and 32 when the lower substrate 2 is supported to the first block 10, as illustrated in FIG. 9, the upper substrate 4 to which the upper electrode 5 is attached may be disposed on the upper ends of the thermoelectric elements 6 and 7.

Next, the second block 20 may be installed on the first block 10 and then the second block 20 may be configured to be pressed toward the first block 10. The bonding material interposed between the lower ends of the thermoelectric elements 6 and 7 and the lower electrode 3 and the bonding material interposed between the upper ends of the thermoelectric elements 6 and 7 and the upper electrode 5 may be each heated by the first heater 13 and the second heater 23, respectively. Accordingly, the thermoelectric elements 6 and 7 may be bonded between the lower electrode 3 and the upper electrode 5.

The thermoelectric elements 6 and 7, the upper electrode 5, the lower electrode 3, the upper substrate 4, the lower substrate 2, or the like may go through the high temperature oxidation by being exposed to the high temperature during the process of manufacturing the thermoelectric module 1. Therefore, according to the exemplary embodiment of the present disclosure, a high temperature anti-oxidation unit 40 that prevents high temperature oxidation may be further provided.

According to the exemplary embodiment of the present disclosure, as illustrated in FIG. 1, the high temperature anti-oxidation unit 40 may include an anti-oxidation gas injection portion 45 that injects anti-oxidation gases such as hydrogen (H2), nitrogen (N2), and argon (Ar) into a cavity between the first block 10 and the second block 20. The anti-oxidation gas injection portion 45 may be connected to a connection pipe 42, in which as the connection pipe 42 may be configured to communicate with the cavity between the first block 10 and the second block 20, the anti-oxidation gas may be injected into the cavity between the first block 10 and the second block 20 from the anti-oxidation gas injection portion 45 through the connection pipe 42. Further, to prevent the anti-oxidation gas from leaking to the exterior, a shielding wall 41 may be installed on an exterior side surface of the first block 10 and the second block 20. In particular, the shielding wall 41 may be installed to allow the vertical movement of the second block 20.

Figure 11:
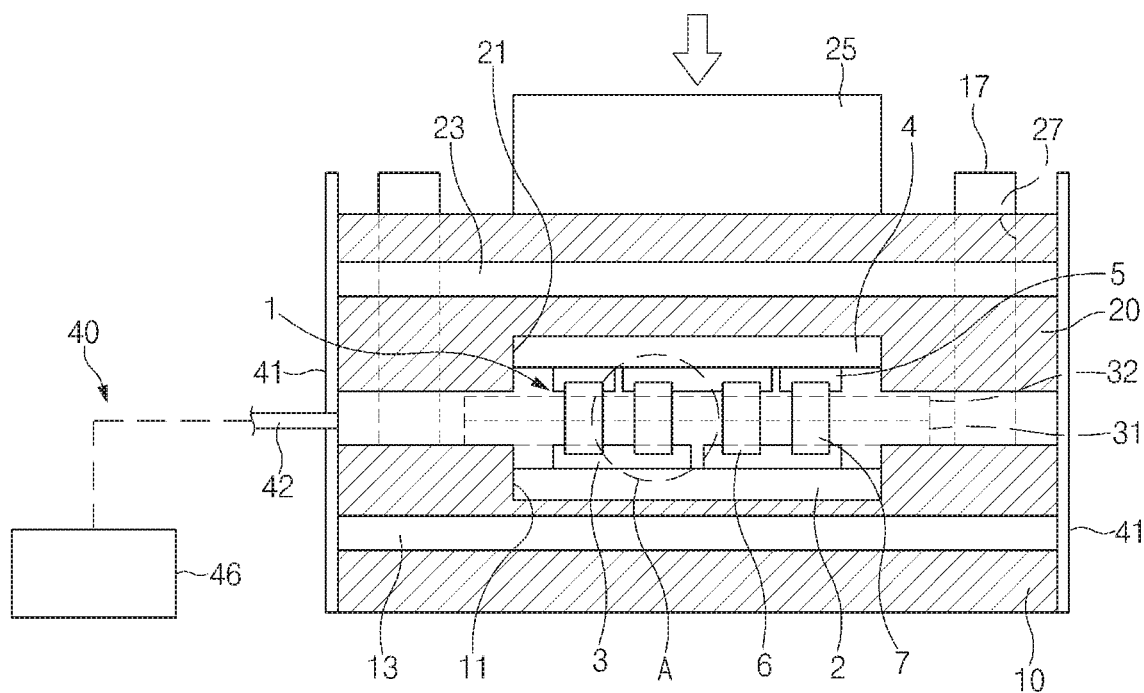
FIG. 11 is an exemplary cross-sectional view illustrating an apparatus for manufacturing a thermoelectric module according to another exemplary embodiment of the present disclosure.

According to another exemplary embodiment of the present disclosure, as illustrated in FIG. 11, the high temperature anti-oxidation unit 40 may include a vacuum suction portion 46 to form the cavity between the first block 10 and the block 20 into vacuum atmosphere. The vacuum suction portion 46 may be connected to the connection pipe 42, when the connection pipe 42 is configured to communicate with the cavity between the first block 10 and the second block 20, the vacuum suction portion 46 may be configured to suction air, or the like from the cavity between the first block 10 and the second block 20 through the connection pipe 42 to form the cavity into the vacuum atmosphere. Further, to form the vacuum atmosphere, the shielding wall 41 may be installed on the exterior side surfaces of the first block 10 and the second block 20. In this case, the shielding wall 41 may be installed to allow the vertical movement of the second block 20.

As set forth above, according to the exemplary embodiments of the present disclosure, the structural stability and the power stability may be improved by more accurately positioning the thermoelectric element with respect to the lower electrode and the upper electrode. Further, position of the thermoelectric element may be stably retained while the thermoelectric element is bonded to the lower electrode and the upper electrode, and in particular, may improve the bonding performance between the thermoelectric element and the electrodes.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims

What is claimed is:

1. An apparatus for manufacturing a thermoelectric module in which a thermoelectric element is disposed between a lower substrate with a lower electrode and an upper substrate with an upper electrode, the apparatus comprising:
   a first block configured to support the lower substrate;
   a second block configured to move vertically with respect to the first block and support the upper substrate;
   a jig configured to position the thermoelectric element in connection with the upper electrode and the lower electrode;
   a shielding wall installed on an exterior side surface of the first block and the second block;
   a first heater embedded within the first block, the first heater configured to apply heat to a first bonding material disposed between the lower electrode and the thermoelectric element; and
   a second heater embedded within the second block, the second heater configured to apply heat to a second bonding material disposed between the upper electrode and the thermoelectric element,
   wherein the first heater extends in a direction parallel to a longitudinal axis of the lower substrate, and the second heater extends in a direction parallel to a longitudinal axis of the upper substrate,
   wherein the first block has a seating groove configured to receive the lower substrate, and
   wherein the first block has a guide portion formed to protrude around the seating groove.

2. The apparatus according to claim 1, wherein the jig includes a slot to receive the thermoelectric element.

3. The apparatus according to claim 2, wherein the jig includes a plurality of jigs vertically arranged, and the slots of the plurality of jigs are arranged to intersect with each other at a predetermined angle and the slots have an overlapping area with each other.

4. The apparatus according to claim 1, wherein the second block has a seating groove configured to receive the upper substrate.

5. The apparatus according to claim 1, wherein a guide structure configured to guide a vertical movement of the second block is installed between the first block and the second block, and the guide structure has a one guide bar that extends in an upward direction from the first block and a guide aperture formed in the second block.

6. An apparatus for manufacturing a thermoelectric module including a lower substrate, a lower electrode, a thermoelectric element, an upper electrode, and an upper substrate, the apparatus comprising:
   a first block configured to support the lower substrate;
   a second block spaced apart from an upper part of the first block and configured to press the upper substrate to the lower substrate;
   a jig configured to position the thermoelectric element between the first block and the second block and retain the positioned state thereof;
   a first heater embedded within the first block, the first heater configured to apply heat to a first bonding material disposed between the lower electrode and the thermoelectric element;
   a second heater embedded within the second block, the second heater configured to apply heat to a second bonding material disposed between the upper electrode and the thermoelectric element; and a shielding wall installed on an exterior side surface of the first block and the second block, wherein the first heater extends in a direction parallel to a longitudinal axis of the lower substrate, and the second heater extends in a direction parallel to a longitudinal axis of the upper substrate, wherein the first block has a seating groove configured to receive the lower substrate, and wherein the first block has a guide portion formed to protrude around the seating groove.

7. The apparatus according to claim 6, wherein the jig includes a first jig having a first slot that extends along a first direction and a second jig having a second slot that extends along a second direction, and the first jig and the second jig are arranged to intersect the first slot and the second slot with each other at a predetermined angle.

8. The apparatus according to claim 7, wherein both ends of the first jig include a pair of first steps configured to be inserted into an edge of the second jig.

9. The apparatus according to claim 7, wherein both ends of the second jig are provided with a pair of second steps configured to be inserted into an edge of the first jig.

* * * * *